United States Patent
Chan et al.

(10) Patent No.: US 10,103,282 B2
(45) Date of Patent: Oct. 16, 2018

(54) DIRECT TEXTURE TRANSPARENT CONDUCTIVE OXIDE SERVED AS ELECTRODE OR INTERMEDIATE LAYER FOR PHOTOVOLTAIC AND DISPLAY APPLICATIONS

(71) Applicant: Nano and Advanced Materials Institute Limited, Hong Kong (HK)

(72) Inventors: Chung Pui Chan, Hong Kong (HK); Wing Hong Choi, Hong Kong (HK); Kwok Keung Paul Ho, Hong Kong (HK)

(73) Assignee: Nano and Advanced Materials Institute Limited, Hong Kong (HK)

(*) Notice: Subject to any disclaimer, the term of this patent is extended or adjusted under 35 U.S.C. 154(b) by 0 days.

(21) Appl. No.: 15/702,776

(22) Filed: Sep. 13, 2017

(65) Prior Publication Data

US 2018/0083161 A1    Mar. 22, 2018

Related U.S. Application Data

(60) Provisional application No. 62/495,498, filed on Sep. 16, 2016.

(51) Int. Cl.
*H01L 31/0236* (2006.01)
*H01L 33/22* (2010.01)
(Continued)

(52) U.S. Cl.
CPC .. *H01L 31/02366* (2013.01); *H01L 21/02554* (2013.01); *H01L 21/02631* (2013.01);
(Continued)

(58) Field of Classification Search
None
See application file for complete search history.

(56) References Cited

U.S. PATENT DOCUMENTS

| 8,404,302 B2 | 3/2013 | Maa et al. |
| 8,492,189 B2 | 7/2013 | Sun et al. |

(Continued)

FOREIGN PATENT DOCUMENTS

| CN | 101429643 A | 5/2009 |
| CN | 101572279 A | 11/2009 |

(Continued)

OTHER PUBLICATIONS

Voisin, Leandro, et al. "Titanium Doped ITO Thin Films Produced by Sputtering Method." Materials Transactions, vol. 51, No. 3, 2010, pp. 503-509., doi:10.2320/matertrans.mbw200907.*

(Continued)

*Primary Examiner* — Joseph Schoenholtz
(74) *Attorney, Agent, or Firm* — Idea Intellectual Limited; Margaret A. Burke; Sam T. Yip

(57) ABSTRACT

The present invention provides transparent semiconducting films for constructing a translucent electrode that possess a high transparency and low sheet resistance. Further, the transparent semiconducting films have a high light diffusion property, which is capable to be a translucent front/back electrode in a light-emitting device for improving the light emission efficiency and a front/intermediate/back electrode in a multi-junction solar cell for improving the light trapping effect. Related fabrication method and how they are applied in different fields are also provided in the present invention.

20 Claims, 6 Drawing Sheets

(51) Int. Cl.
H01L 33/06 (2010.01)
H01L 33/42 (2010.01)
H01L 21/02 (2006.01)
H01L 31/18 (2006.01)
H01L 31/0725 (2012.01)
H01L 33/32 (2010.01)

(52) U.S. Cl.
CPC ...... *H01L 31/0725* (2013.01); *H01L 31/1888* (2013.01); *H01L 33/06* (2013.01); *H01L 33/22* (2013.01); *H01L 33/42* (2013.01); *H01L 33/32* (2013.01); *H01L 2933/0016* (2013.01)

(56) References Cited

U.S. PATENT DOCUMENTS

| | | | |
|---|---|---|---|
| 9,070,803 | B2 | 6/2015 | Yang et al. |
| 2007/0209928 | A1* | 9/2007 | Inoue .................. C23C 14/086 204/192.15 |
| 2009/0072262 | A1* | 3/2009 | Iza .......................... H01L 33/04 257/98 |
| 2011/0168259 | A1* | 7/2011 | Murata ............. H01L 31/03682 136/258 |
| 2011/0194181 | A1* | 8/2011 | Takahashi ............. C23C 14/086 359/585 |
| 2011/0315214 | A1* | 12/2011 | Yamanobe .......... C03C 17/3618 136/256 |
| 2011/0315936 | A1* | 12/2011 | Inoue .................. C23C 14/086 252/512 |
| 2012/0255602 | A1 | 10/2012 | Schmidt et al. |
| 2015/0014151 | A1* | 1/2015 | Shin .................... C23C 14/3414 204/192.26 |
| 2015/0303327 | A1* | 10/2015 | Sogabe .................. C23C 14/08 136/256 |
| 2016/0104608 | A1* | 4/2016 | Sato ...................... C23C 14/086 204/298.13 |
| 2017/0077327 | A1* | 3/2017 | Hiraga ................ H01L 31/0323 |

FOREIGN PATENT DOCUMENTS

| | | |
|---|---|---|
| CN | 101582468 A | 11/2009 |
| CN | 101882632 A | 11/2010 |
| CN | 102044593 A | 5/2011 |
| CN | 102199759 A | 9/2011 |
| CN | 102623569 A | 8/2012 |
| CN | 203212630 U | 9/2013 |
| JP | 2004190052 A | 7/2004 |
| JP | 2005243187 A * | 9/2005 |
| JP | 2013040394 A * | 2/2013 |

OTHER PUBLICATIONS

Ohshima, Tamiko, et al. "Sputtering Deposition of Al-Doped Zinc Oxide Thin Films Using Mixed Powder Targets." Japanese Journal of Applied Physics, vol. 55, No. 1S, 2015, doi:10.7567/jjap.55.01aa08.*
Grew, B.; Bowers, J. W.; Lisco, F.; Arnou, N.; Walls, J. M.; Upadhyaya, H. M. High Mobility Titanium-doped Indium Oxide for Use in Tandem Solar Cells Deposited via Pulsed DC Magnetron Sputtering. Energy Procedia 2014, 60, 148-155.*
Kang, Saewon, Cho, Sanghyun, & Song, Pungkeun (May 2014). Effect of cerium doping on the electrical properties of ultrathin indium tin oxide films for application in touch sensors. Thin Solid Films, 92-95. doi:101016/jtsf201311056.*
Abe, Y., et al. "Amorphous Indium Tungsten Oxide Films Prepared by DC Magnetron Sputtering." Journal of Materials Science, vol. 40, No. 7, 2005, pp. 1611-1614., doi:10.1007/s10853-005-0660-5.*
Zhang, Zhiyun, et al. "Influence of Deposition Temperature on the Crystallinity of Al-Doped ZnO Thin Films at Glass Substrates Prepared by RF Magnetron Sputtering Method." Superlattices and Microstructures, vol. 49, No. 6, 2011, pp. 644-653., doi:10.1016/j.spmi.2011.04.002.*

J. Bailat et. al., "Recent Developments of High Efficiency Micromorph Tandem Solar Cells in KAI-M PECVD reactors", EU PVSEC Conference Paper, 2011, p. 2720-2723.
P. Obermeyer et. al., "Textured ZnO Enables High-efficiency Silicon Solar Modules", Renewable Energy World, 2010, p. 1-5.
R. Horng et. al., "Efficiency Improvement of GaN—Based LEDs with ITO Texturing Window Layers Using Natural Lithography", IEEE Journal of Selected Topics in Quantum Electronics, vol. 12, 2006, p. 1196-1201.
S. Li et. al., "Efficiency Improvement of GaN-based Light-emitting Diodes by Direct Wet Etching of Indium-tin-oxide Layer", IET Optoelectronics, vol. 6, 2012, p. 303-306.
S. Nicolay et. al., "Control of CVD-deposited ZnO Films Properties through Water/DEZ Ratio: Decoupling of Electrode Morphology and Electrical Characteristics", Solar Energy Materials & Solar Cells, vol. 105, 2012, p. 46-52.
C. David et. al., "Microstructural and Conductivity Changes Induced by Annealing of ZnO:B Thin Films Deposited by Chemical Vapour Deposition", Journal of Physics: Condensed Matter, vol. 23, 2011, p. 1-6.
M. Despeisse et. al., "Research and Developments in Thin-Film Silicon Photovoltaics", Proc. of SPIE, vol. 7409, 2009, p. 1-15.
M. Boccard et. al., "Unlinking Absorption and Haze in Thin Film Silicon Solar Cells Front Electrodes", Phys. Status Solidi RRL, vol. 4, 2010, p. 326-328.
J. Steinhauser et. al., "Humid Environment Stability of Low Pressure Chemical Vapor Deposited Boron Doped Zinc Oxide Used as Transparent Electrodes in Thin Film Silicon Solar Cells", Thin Solid Films, vol. 520, 2011, p. 558-562.
D. W. Sheel et. al., "Atmospheric Pressure Chemical Vapour Deposition of F Doped SnO2 for Optimum Performance Solar Cells", Thin Solid Films, vol. 517, 2009, p. 3061-3065.
H. M. Yates et. al., "High-performance Tandem Silicon Solar Cells on F:SnO2", Surface & Coatings Technology, vol. 230, 2013, p. 228-233.
K. Chang et. al., "Enhancement of the Light-Scattering Ability of Ga-doped ZnO Thin Films Using SiOx Nano-films Prepared by Atmospheric Pressure Plasma Deposition System", Thin Solid Films, vol. 548, 2013, p. 460-464.
X. Yan et. al., "Modified Surface Texturing of Aluminium-Doped Zinc Oxide (AZO) Transparent Conductive Oxides for Thin-Film Silicon Solar Cells", Energy Procedia, vol. 33, 2013, p. 157-165.
M. Vanecek et. al., "Nanostructured Three-dimensional Thin Film Silicon Solar Cells with Very High Efficiency Potential", Applied Physics Letters, vol. 98, 2011, p. 1-4.
M. M. Hilali et. al., "Corrigendum: Enhanced Photocurrent in Thin-film Amorphous Silicon Solar Cells via Shape Controlled Three-dimensional Nanostructures", Nanotechnology, vol. 24, 2013, p. 1.
A. Bessonov et. al., "Nanoimprint Patterning for Tunable Light Trapping in Large-area Silicon Solar Cells", Solar Energy Materials & Solar Cells, vol. 95, 2011, p. 2886-2892.
K. Yang et. al., "Direct Indium Tin Oxide Patterning Using Thermal Nanoimprint Lithography for Highly Efficient Optoelectronic Devices", Journal of Vacuum Science & Technology B, vol. 27, 2009, p. 2786-2789.
A. N. Banerjee et. al., "Nanocrystalline ZnO Thin Film Deposition on Flexible Substrate by Low-Temperature Sputtering Process for Plastic Displays", Journal of Nanoscience and Nanotechnology, vol. 14, 2014, p. 7970-7975.
T. Tohsophon et. al., "High Rate Direct Current Magnetron Sputtered and Texture-etched Zinc Oxide Films for Silicon Thin Film Solar Cells", Thin Solid Films, vol. 516, 2008, p. 4628-4632.
E.Miorin et. al., "Textured Transparent Conductive Oxide Thin Films With Uniform Properties On Large Scale", CNR-Institute for Energetics and Interphases, p. 1.
Rahul Dewan et. al., "Analyzing periodic and random textured silicon thin film solar cells by Rigorous Coupled Wave Analysis", Scientific Reports, 2014, 4 (6029), p. 1-7.

(56) References Cited

OTHER PUBLICATIONS

Zhifang Lei et. al., "Development of aluminum-doped ZnO films for a-Si:H/µc-Si:H solar cell applications", Journal of Semiconductors, 2013, vol. 34 (6), p. 063004-1-063004-5.

* cited by examiner

DIRECT TEXTURE TRANSPARENT CONDUCTIVE OXIDE SERVED AS ELECTRODE OR INTERMEDIATE LAYER FOR PHOTOVOLTAIC AND DISPLAY APPLICATIONS

CROSS-REFERENCE TO RELATED APPLICATIONS

This application claims priority from the U.S. provisional patent application Ser. No. 62/495,498 filed Sep. 16, 2016, and the disclosure of which is incorporated herein by reference in its entirety.

TECHNICAL FIELD

The present invention relates to transparent semiconducting films for constructing a translucent electrode having high transparency and low sheet resistance or for a translucent front or back electrode in a light-emitting device or in a multi-junction solar cell. The present invention also relates to methods of fabricating the transparent semiconducting films and how said transparent semiconducting films are used in different applications including photovoltaic cell and display.

BACKGROUND

The following references are incorporated herein by reference in their entirety:
U.S. Pat. No. 8,404,302
U.S. Pat. No. 8,492,189
U.S. Pat. No. 9,070,803
US20120255602A1
CN203212630U
CN101429643A
CN101572279A
CN101582468A
CN101882632A
CN102044593A
CN102199759A
CN102623569A
JP2004190052A
BANERJEE, A. et al., Nanocrystalline ZnO Thin Film Deposition on Flexible Substrate by Low-temperature Sputtering Process for Plastic Displays, (Research Paper), Journal of Nanoscience and Nanotechnology, October 2014, Pp. 7970-7956, Vol. 14, No. 10.2011.
TOHSOPHON, T. et al., High Rate Direct Current Magnetron Sputtered and Texture etched Zinc Oxide Films for Silicon Thin Film Solar Cells, Proceedings for 6th International Conference on Coatings on Glass and Plastics (ICCG6)-Advanced Coatings for Large-Area or High-Volume Products, Jun. 14, 2007, Pp. 4628-47632, Vol. 516, No. 14.
MIORIN, E. et al., Textured Transparent Conductive Oxide Thin Films with Uniform Properties on Large Scale.
DEWAN, R. et al., Analyzing Periodic and Random Textured Silicon Thin Film Solar Cells by Rigorous Coupled Wave Analysis, Aug. 12, 2014.
ZHIFANG, L. et al., Development of Aluminum-doped ZnO Films for a-Si:H/_c-Si: H Solar Cell Applications, (Research Paper), Journal of Semiconductors, June 2013.

The following cited references are also incorporated herein by reference in their entirety:
[1]. J. Bailat, L. Fesquet, J.-B Orhan, Y. Djeridane, B. Wolf, et. al.; "Recent Developments of High-Efficiency Micromorph® Tandem Solar Cells in KAI-M PECVD Reactors", Processing of the 25th European Photovoltaic Solar Energy Conference and Exhibition/5th World Conference on Photovoltaic Energy Conversion, 6-10 Sep. 2010, Valencia, Spain (2011) p. 2720-2723.
[2]. P. Obermeyer, D. Severin, M. Kress, S. Klein, U. I. Schmidt, S. Wieder "Textured ZnO enables high-efficiency silicon solar modules", Renewable Energy, July (2010)
[3]. R. H. Horng, S. H. Huang, C. C. Yang and D. S. Wuu; "Efficiency Improvement of GaN-Based LEDs with ITO Texturing Window Layers Using Natural Lithography", IEEE Journal of Quantum Electronics, Vol. 12, (2007) p. 1196-1201.
[4]. S. Li, D. S. Kuo, C. H. Liu, S. C. Hung, S. J. Chang; "Efficiency improvement of GaN-based light-emitting diodes by direct wet etching of indium-tin-oxide layer", IET Optoelectron., 2012, Vol. 6, p. 303-306.
[5]. S. Nicolay, M. Benkhaira, L. Ding, J. Escarre, G. Bugnon, F. Meillaud and C. Ballif; "Control of CVD-deposited ZnO films properties through water DEZ ratio Decoupling of electrode" Solar Energy Materials & Solar Cells, Vol. 105 (2012) p. 46-52.
[6]. C David, T Girardeau, F Paumier, D Eyidi, B Lacroix, N Papathanasiou, B P Tinkham, P Guerin and M Marteau; "Microstructural and conductivity changes induced by annealing of ZnO:B thin films deposited by chemical vapour deposition", Journal of Physics: Condensed Matter, Vol. 23 (2011).
[7]. M. Despeisse, C. Ballifa, A. Feltrina, F. Meillauda, S. Faya, F-J. Hauga, D. Dominéa, M. Pythona, T. Soderstroma, P. Buehlmanna, G. Bugnona, G. Parascandolo; "Research and Developments in Thin-Film Silicon Photovoltaics", Proceeding of SPIE, Vol. 7409 (2012).
[8]. M. Boccard, P. Cuony, C. Battaglia, M. Despeisse, and C. Ballif; "Unlinking absorption and haze in thin film silicon solar cells front electrodes", Phys. Status Solidi RRL, Vol. 4, (2010) p. 326-328.
[9]. J. Steinhauser, S. Meyer, M. Schwab, S. Faÿ, C. Ballif, U. Kroll, D. Borrello; "Humid environment stability of low pressure chemical vapor deposited boron doped zinc oxide used as transparent electrodes in thin film silicon solar cells", Thin Solid Film, Vol. 520 (2011) p. 558-562.
[10]. D. W. Sheela, H. M. Yatesa, P. Evansa, U. Dagkaldiranc, A. Gordijnc, F. Fingerc, Z. Remesd, M. Vanecekd, "Atmospheric pressure chemical vapour deposition of F doped SnO2 for optimum performance solar cells" Thin Solid Films, Vo. 517, (2009) p. 3061-3065.
[11]. H. M. Yatesa, P. Evansa, D. W. Sheela, S. Nicolayc, L. Dingc, and C. Ballifc; "High-performance tandem silicon solar cells on F:SnO2", Surface and Coatings Technology, Vol. 230, (2013) p. 228-233.
[12]. K. M. Chang, P. C. Ho a, A. Ariyarit, K. H. Yang, J. M. Hsu, C. J. Wu, C. C. Chang; "Enhancement of the light-scattering ability of Ga-doped ZnO thin films using SiOx nano-films prepared by atmospheric pressure plasma deposition system", Thin Solid Films, Vol. 548 (2013), p. 460-464.
[13]. X. Yan, S. Venkataraj, A. G. Aberle; "Modified Surface Texturing of Aluminium-Doped Zinc Oxide (AZO) Transparent Conductive Oxides for Thin-Film Silicon Solar Cells", Proceedings of PV Asia Pacific Conference 2012, Vol. 33 (2013), p. 157-165.
[14]. M. Vanecek, O. Babchenko, A. Purkrt, J. Holovsky, N. Neykova, A. Poruba, Z. Remes, J. Meier, and U. Kroll;

"Nanostructured three-dimensional thin film silicon solar cells with very high efficiency potential", Applied Physics Letters, Vol. 98 (2011).

[15]. M. M Hilali, S. Yang, M. Miller, F. Xu, S. Banerjee and S. V. Sreenivasan; "Corrigendum: Enhanced photocurrent in thin-film amorphous silicon solar cells via shape controlled three-dimensional nanostructures" Nanotechnology, Vol. 24 (2013)

[16]. A. Bessonov, Y. Cho, S. J. Jung, E. A. Park, E. S. Hwang, J. W. Lee, M. Shin, S. Lee; "Nanoimprint patterning for tunable light trapping in large-area silicon solar cells", Solar Energy Materials & Solar Cells, Vol. 95 (2011) 2886-2892.

[17]. K. Y. Yang, K. M. Yoon, S. W. Lim, H. Lee; "Direct indium tin oxide patterning using thermal nanoimprint lithography for highly efficient optoelectronic devices", Journal of Vacuum Science & Technology B: Microelectronics and Nanometer Structures, Vol. 27 (2009) 2786-2789.

Transparent semiconducting thin film coatings have been widely used in photovoltaic, display and solid-state lighting industries due to their good electrical conductivity and optical transparency. To enhance the device performance of solar cells and light-emitting diodes (LEDs), surface-texturing of transparent conducting thin film is generally required for improving light trapping or light extraction properties in the transparent semiconducting thin film deposition processes.

A well-known technique for forming surface-texturing on a transparent semiconducting film is by wet-etching method that uses additional acid or alkaline solutions to react with the film surface. The method is effective to create texturing surface. However, the surface may be over etched by the chemicals to cause some pin-hole defects. The residue of the chemical may also form some localized defects on the layer. In addition, the post-etching process is difficult to apply in a large-scale production since the control should be precise for retaining a good reproducibility.

Chemical vapor deposition (CVD) is another promising method for forming texturing transparent conducting thin film. In industry, CVD is widely used to produce good performance transparent texturing films with good reproducibility, even in a large-scale production. However, this method would require complicated chemical reactions under high temperature as well as expensive toxic gases, thus leading to additional costs and environmental issue.

For photovoltaic applications, research team from Neuchatel University and Oerlikon solar [1] investigating thin film silicon solar cell has reported that the textured TCO electrodes allows a 40% reduction of absorber thickness to achieve the same conversion efficiency in the Micromorph devices, which was reduced from 1300 nm to 780 nm, because of the improvement of the light trapping effect. Applied Materials [2] have shown that the surface roughened TCO increases the effective light path so as to enhance the long wavelength (650 to 1100 nm) absorption in a tandem solar cell, which generates approximately 15% more current (FIG. 3). For lighting and display applications, the surface-textured TCO window layers of the LEDs not only solve the current spreading problems but also reduce the problematic internal reflections, leading to a higher brightness LED. A study on GaN based LED has reported that extraction quantum efficiency of the ITO/GaN LEDs with and without textured surface is 22.6% and 17.4%, respectively [3]. A similar investigation using wet etch to form the texture on ITO layer has found that output power of the LEDs after etching is 21% higher than that of conventional LEDs [4]. Low Pressure Chemical Vapor Deposition (LPCVD) technology produces high quality textured boron doped ZnO (BZO) and this TCO material has been widely used in the silicon thin film photovoltaic industry and LCD display panel industry, which is adopted by Oerlikon and Tokyo Electronics. During the BZO deposition process, the deposition occurs as a result of chemical reactions of vapor phase precursors on a heated substrate. Diethylzinc (DEZ, (C2H5)2Zn), which structure is shown in FIG. 4, and water vapor (H2O) are used as precursors [5-6]. As the DEZ is a metal organic compound, the process is also called metalorganic chemical vapor deposition (MOCVD). The hydrolysis reaction that leads to the formation of ZnO from DEZ and water vapor during CVD is described via the equations:

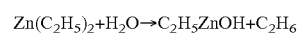

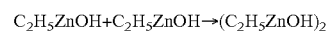

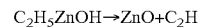

The chemical reactions are complicated and require relatively thick TCO material [7-8] which is about to be 2 to 5 um to form the textures (FIG. 5). The process uses some highly toxic processing gases, such as Diethyl zinc and Diborane, and expensive LPCVD vacuum systems. Therefore, the manufacturing process is high cost and induces environmental problems. Finally, a serious technical concern is that this BZO material will be degraded and lost its electrical conductivity when the materials are exposed to atmosphere moisture environment for several days [9] without further protection, thus limiting this technology to be in-house production use only. Atmospheric Pressure Chemical Vapor Deposition (APCVD) is another commonly used commercial technology to produce the textured fluorine doped tin-oxide (SnO2:F) coatings, which is currently adopted by Pilkington, Nippon Sheet Glass and Asahi Glass. In this APCVD process, the substrate is heated to 600 to 1,000 degree C. during the glass forming process on the tin bath, and the precursor gases namely tin tetrachloride, hydrogen fluoride and water vapor are reacted on the substrate [10-11]. The films can be grown with a textured surface morphology. The chemical reaction is described by the following formula:

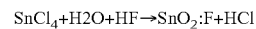

The optical absorption coefficient in the visible range is often quite high (~400 to 600 cm-1) for the commercial FTO. Similar to the LPCVD technology, APCVD also involves not very environmentally friendly chemical process, expensive equipment and toxic gases (tin tetrachloride and hydrogen fluoride). Apart from the above concerns, high deposition temperature, lower optical transmission in UV & NIR regions and poor plasma resistance (FIG. 6) have limited the choices of substrate materials and induced lots of process constrains [12].

To get rid of expensive and complicated CVD processes, physical vapour deposition sputtering processing followed by wet chemical etching has been developed to form textured ZnO TCO coatings, which has been adopted by Ulvac and XinYi glass. In the sputtering process, atoms are physically removed from the solid target due to the bombardment by energetic particles such as argon ions. The ejected atoms are deposited on the substrate to form a thin film. A scheme of a sputter deposition system is depicted in FIG. 7. A negative high voltage can be applied to the target, a glow discharge of the gas is generated and the plasma is formed under the electric field between target and substrates. Compared to using the CVD processes, this processing requires a relatively lower processing temperature (not higher than 400 degree C.) and normally not involves using toxic gases. The equipment cost is less expensive. However, deposition of extra TCO material (Total material thickness of 4 to 5 m before etching) is required to form texture after wet etch, which is very difficult to control, leading to high material usage, low yield and pin-hole defects (FIG. 8) [13].

In some literatures, 3D patterning of TCO based of nanorods has attracted lots of attention for its potential light scattering effects on thin film solar cells. Vanecek et. al [14] presented results of optical modeling, where he predicted this TCO can greatly improve the efficiency of thin film silicon tandem cell from 11% to 15% with 60% reduction on absorbing materials. The design concept is aiming at decoupling the light path (a long path along the pillar) from the current path (perpendicular to the nano-rod). This permits the TCO to be thinner (~100 nm perpendicular to the pillar) and lower low light induced degradation while still having large thicknesses for the absorption of the light. However, these nano-pillars are not easy to scale up for manufacturing. SEM images of hydrothermally grown ZnO pillars are shown in FIG. 9, but the distance between the pillars is difficult to control [15].

Recently, Samsung electronics and Korea University have developed the nano-imprint lithography fabrication to form a highly textured TCO and the process flow is shown in FIG. 10. A textured polymeric layer covered with pyramidal transparent conductive oxide structures is fabricated with a 5% improved transmission in UV-visible range [16-17]. However, nano-imprint technology is difficult to scale up and the process is very expensive.

A solution to minimize the index matching issues and strengthening the adhesion between the substrates and the transparent conductive coatings is therefore needed. In addition, a green and simple direct formation of textured TCO film and related process are highly desirable.

In U.S. Pat. No. 8,404,302, a solution process is employed which involves using metal oxide nanoparticles for forming the patterned layer as the first layer while the second layer will overlay on top of the first layer. As above mentioned, solution process is efficient to texture a film surface but it may cause defects and not suitable for large-scale production.

In U.S. Pat. No. 9,070,803, molecular imprint is employed which firstly forms a pattern layer and then deposits another conducting material on the patterned layer, which is a more complicated process. In addition, the disclosed method in this patent is more suitable for amorphous silicon PIN structure.

In CN102044593A, although sputtering is used in the deposition process, the disclosed method involves an additional formation of a patterned metal layer before forming the nano-texture TCOs thereon. It is not a direct texturing method on the TCOs which the present invention is intended to employ.

SUMMARY OF INVENTION

In order to address the above-mentioned technical problems in the prior art, the first aspect of the present invention relates to transparent semiconducting films in a bi-layer structure including a surface-textured TCO coating formed by a two-step sputtering process with at least two metal oxides having two different crystalline temperatures, for example, one of the metal oxides has a first crystalline temperature while the other of the metal oxides has a second crystalline temperature of about 50° C. lower or higher than the first crystalline temperature. An example of a desirable pair of metal oxides having said crystalline temperature difference are $In_2O_3$ based and $ZnO/SnO_2$ based materials, respectively, which are doped with their corresponding dopants, and the present invention does not require any wet-etching or complicated CVD processes. Compared to the conventional processes, this direct-textured sputtering method features with the following advantages: relatively lower processing temperature, lesser material usage, improved near-infrared transmission and light scattering effects, no expensive toxic gases and no wet-etching chemicals. It also avoids using toxic gas, environmental-friendly, ease of fabrication and low cost. As-fabricated transparent semiconducting films according to the present invention can be directly used in light-emitting devices such as nitride-based light-emitting device, or as a surface electrode (front or back) for improving light extraction thereof. Other application of said transparent semiconducting films includes being an intermediate layer of a multi-junction solar cell for improving light trapping effect and light transmittance thereof.

In an exemplary embodiment, said transparent semiconducting films include a bottom film and a top film with a textured surface sequentially deposited on a substrate. Said substrate can be opaque or transparent, depending on the application of the transparent semiconducting films. Said bottom film is formed on said substrate and includes a first metal oxide doped with a second metal oxide to form a two-metal oxide-based film having high refractive index or high transmittance at near infra-red (NIR) range. In a preferred embodiment, said bottom film has a thickness between 250 and 400 nm. More preferably, said bottom film has a thickness of about 350 nm. Said bottom film with a thickness as such has sufficient surface roughness and pronounced haze effect while certain light transmittance is reached. Said first metal oxide is indium oxide ($In_2O_3$) doped with said second metal oxide which is one selected from the group consisting of titanium oxide ($TiO_2$), cerium oxide ($CeO_2$), tungsten oxide ($WO_3$) and tin oxide ($SnO_2$). In other embodiment, said first metal oxide can be $SnO_2$, ZnO, CdO, $InO_{1.5}$, or $GaO_{1.5}$, which is doped with other dopants to obtain $Zn_2SnO_4$, $ZnSnO_3$, $CdSnO_4$, $ZnGa_2O_4$, $GaInO_3$, $Zn_2In_2O_5$, Zr-doped ZnO, $Zn_3In_2O_6$, $Zn_4In_2O_7$, Ga—In—Sn—O, Zn—In—Sn—O, Ga—In—O and Zn—In—O. In another embodiment, said first metal oxide can also be NiO, $CuMO_2$, where M=Al, Ga, In, Sc, Cr, Y, B, etc., i.e., $CuAlO_2$, $CuScO_2$, $CuYO_2$, $CuInO_2$, $CuBO_2$, $CuGaO_2$, and $CuCrO_2$, oxychalogenides (LaCuOS), delafossite (Mg doped $CuCrO_2$). Weight ratio of said first metal oxide to said second metal oxide is from 99:1 to 9:1. Said top film is sequentially deposited on said bottom film and includes a third metal oxide doped with a fourth metal oxide. In a preferred embodiment, said top film has a second thickness between 1,000 and 2,000 nm. More preferably, said top film has a second thickness of about 1,650 nm. Said top film with a thickness as such has sufficient surface roughness and pronounced haze effect while certain light transmittance is reached. The surface roughness and haze effect can vary by changing processing temperature during formation of said top film on said bottom film. Said third metal oxide is selected from zinc oxide (ZnO) or tin oxide ($SnO_2$) doped with said fourth metal oxide which is one selected from the group consisting of gallium oxide ($Ga_2O_3$), aluminum oxide ($Al_2O_3$), boron oxide ($B_2O_3$) and antimony oxide ($Sb_2O_3$). In one embodiment, the processing temperature during the formation of said bottom film is about 25° C. In other embodiment, the processing temperature during the formation of said top film is from 25° C. to 350° C. More preferably, the processing temperature during the formation of said top film is from 300° C. to 350° C. In a specific embodiment, a pronounced pyramid-like shape is formed on the surface of said top film when the processing temperature is about 300° C. Simultaneously, said substrate is annealed when said surface-textured top film is formed on said bottom film at said processing temperature. Multiple repeating units or stacks of said bottom and top films can be formed on the same substrate.

The second aspect of the present invention relates to a method of fabricating the transparent semiconducting films according to the first aspect of the present invention. Said method is a sequential deposition process of said bottom and top films on a clean substrate using sputtering (vacuum or reactive sputtering) instead of wet-etching or CVD. Said method includes: cleaning the substrate by organic solvents and deionized water before loading into a vacuum sputtering chamber; loading said clean substrate into said vacuum sputtering chamber; first sputtering said bottom film on said substrate for a first thickness under a mixture of two non-toxic gases and under a first operating power and a first operating pressure; second sputtering said top film on said bottom film for a second thickness under a non-toxic gas and under a second operating power and a second operating pressure at a processing temperature; annealing said substrate during said second sputtering; monitoring said first and second thicknesses by a calibrated crystal quartz sensor during said first and second sputtering.

In a first embodiment, said first processing temperature is about 25° C., room temperature, or a temperature below the crystalline temperature of any of said metal oxides.

In a second embodiment, said second processing temperature is from 25° C., room temperature, or a temperature below the crystalline temperature of any of said metal oxides to 350° C.

In any of the embodiments of the present invention, the crystalline temperature of any of said metal oxides ranges from 150 to 550° C.

In a third embodiment, said second processing temperature is about 300° C.

In a fourth embodiment, said first thickness is from 150 nm to 2,200 nm.

In a fifth embodiment, said first thickness is from 150 nm to 600 nm.

In a sixth embodiment, said first thickness is from 250 nm to 400 nm.

In a sixth embodiment, said first thickness is about 350 nm.

In a seventh embodiment, said second thickness is from 1,000 nm to 2,000 nm.

In an eighth embodiment, said second thickness is from 1,500 nm to 2,000 nm.

In a ninth embodiment, the mixture of two non-toxic gases includes argon and oxygen. Preferably, the ratio of argon to oxygen in said mixture is 99:1.

In a tenth embodiment, the first processing power used in said first sputtering is about 200 W.

In an eleventh embodiment, the first processing pressure used in said first sputtering is about 3.0 mTorr In a twelfth embodiment, the second processing power used in said second sputtering is about 400 W.

In a thirteenth embodiment, the second processing pressure used in said second sputtering is about 3.0 mTorr.

In a fourteenth embodiment, a plurality of pronounced pyramid-like shaped structures is formed on the surface of said top film when the second processing temperature is about 300° C.

BRIEF DESCRIPTION OF THE DRAWINGS

Embodiments of the present invention are described in more detail hereinafter with reference to the drawings, in which.

DETAILED DESCRIPTION OF INVENTION

In the following description, the present bi-layer semiconductor and method of fabrication thereof under different parameters are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Figure 1:
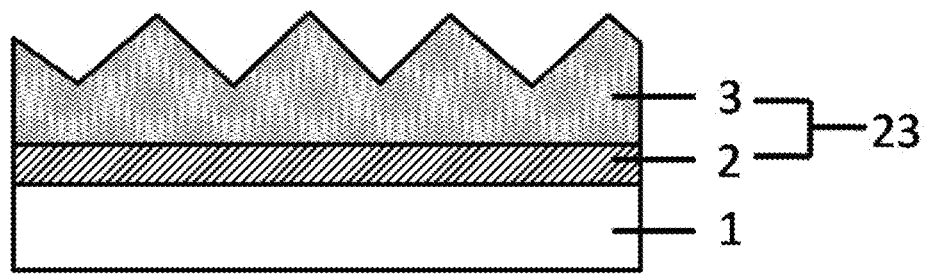
FIG. 1 is the cross-sectional view showing the constitution of a bi-layer transparent semiconducting thin film structure on a substrate according to an embodiment of the present invention.

FIG. 1 is the cross-sectional view showing the constitution of a thin film according to a preferred embodiment of the present invention. The thin film has a bottom film 2 and a pyramid shaped top film 3 grown on a substrate 1 sequentially.

The substrate 1 can be opaque or transparent substrate. For light transmitting purpose, transparent glass with good visible transmittance is preferable as the substrate 1 for thin films grown on top. Extended to the near infrared (NIR) transmission, low-iron glass as the substrate 1 can be an example.

The transparent semiconducting films formed on the substrate 1 comprising of a bottom film 2 of an indium oxide ($In_2O_3$) based semiconducting layer and a pyramid shaped top film 3 of a zinc oxide (ZnO) based semiconducting layer, possesses a sheet resistance less than 15 ohm/sq and a transmittance not less than 85%.

The bottom film 2 of the indium oxide based semiconducting layer doped with the metal oxide selected from the group consisting of titanium oxide ($TiO_2$), cerium oxide ($CeO_2$), tungsten oxide ($WO_3$) or tin oxide ($SnO_2$). The indium oxide doped with cerium oxide, namely ICO, for example, may be used. The ICO film has a high refractive index of 2.1 which is able to reduce the refractive index difference with some high refractive index substrates, like nitride-based semiconductor. Other examples, the indium oxide either doped with titanium oxide or tungsten oxide, namely of ITiO and IWO, may be used. The ITiO and IWO have a high transmission at NIR range, which are able to use in NIR related device.

The bottom film 2 of the indium oxide based semiconducting layer as the bottom film 2 can assist the texture formation of the top film 3 of the zinc oxide (ZnO) based semiconducting layer, thereby improves the surface roughness. The thickness of the bottom film 2 is preferably within 250 to 400 nm. If the film thickness is below 250 nm, the surface roughness is reduced and the haze effect is not pronounced. If the film thickness is more than 400 nm, the light transmittance is reduced.

The top film 3 of the zinc oxide (ZnO) based semiconducting layer doped with the metal oxide selected from the group consisting of gallium oxide ($Ga_2O_3$) and aluminum oxide ($Al_2O_3$). The surface roughness of the top film 3 can be governed the film thickness. The thickness of the top film 3 is preferably within 1000 to 2000 nm. If the film thickness is below 1000 nm, the surface roughness is reduced and the haze effect is not pronounced. If the film thickness is more than 2000 nm, the light transmittance is reduced.

In addition to the surface roughness, the processing temperature of the top film 3 can change the surface morphology and thereby changes the haze effect. The processing temperature of the top film 3 is preferably at 300° C. or above, to form a pronounced pyramid shape on the film surface. If the processing temperature is less than 300° C., it would form a less pronounced pyramid surface and reduce the haze effect.

The preparation method of the transparent semiconducting texturing films will now be described. The bottom film 2 and the top film 3 are sequentially deposited on the substrate 1 by the RF magnetron sputtering method (e.g. vacuum sputtering by oxide based targets or using reactive sputtering by metallic targets), according to the constitution of a thin film structure shown in FIG. 1. The substrate 1 is sequentially cleaned by acetone, isopropanol and deionized water before loading in a vacuum sputtering chamber for the thin film deposition. The bottom film 2 is formed on the substrate 1 by sputtering a 4 inches indium oxide based target doped with the metal oxide consisting of titanium oxide ($TiO_2$) and tin oxide ($SnO_2$). The target is sputtered by a mixture gas of argon and oxygen (in a ratio of 99 to 1) at a RF power of 200 W and an operating pressure of 3.0 mTorr. Afterwards, the top film 3 is formed on the bottom film 2 by sputtering a 4 inches zinc oxide (ZnO) based target doped with the metal oxide consisting of gallium oxide ($Ga_2O_3$) and aluminum oxide ($Al_2O_3$). The target was sputtered by a pure gas of argon at a RF power of 400 W and an operating pressure of 3.0 mTorr. The substrate 1 is annealed at a set temperature during the film 3 deposition. The thicknesses of film 2 and 3 are monitored by a calibrated crystal quartz sensor. It is possible to substitute ZnO with tin oxide ($SnO_2$) as the base material for top film 3, and the corresponding metal oxide dopant is selected from gallium oxide ($Ga_2O_3$), aluminum oxide ($Al_2O_3$), or antimony oxide ($Sb_2O_3$).

The transparent semiconducting films formed on the substrate 1 is then measured by different techniques to obtain the optical, surface and electrical characteristics. The optical transmittance is measured by an integrated sphere equipped in the UV-VIS-NIR spectrometer. The sheet resistance is probed by a Hall-effect measurement system. The surface morphology and roughness are inspected by the scanning electronic microscopy (SEM) and atomic force microscopy (AFM).

EXAMPLES

The embodiments of the present invention will now be described with several examples. Examples 1.1-1.5, 2.1-2.3 and 3.1-3.5 are, respectively, working examples demonstrating the effect of different processing temperature and/or different thickness of the bottom film 2 and the top film 3 thickness on forming the transparent semiconducting films. The comparative examples 1.1 and 1.2 are the counter examples to illustrate the function of the bottom film 2 in assisting the surface-texturing on the top film 3. The parameters of optical, electrical and surface characteristics from the examples are summarized in TABLE 1.

Example 1.1

Figure 2:
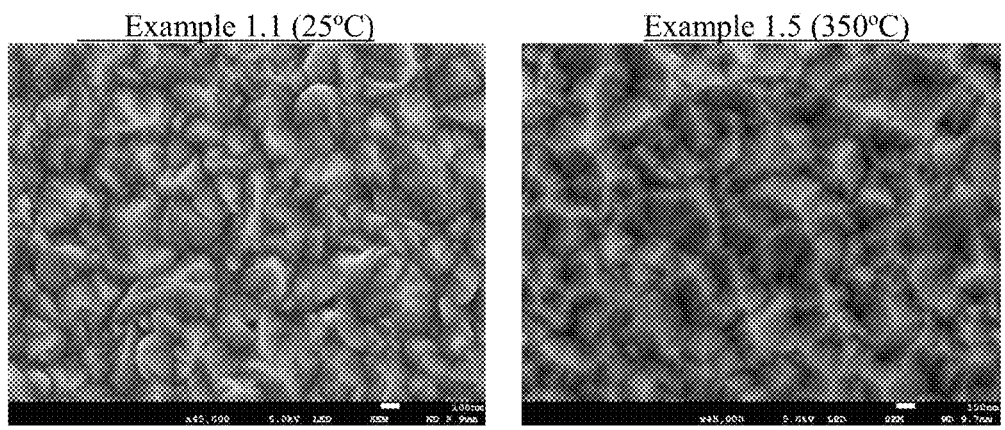
FIG. 2 is the scanning electronic microscopy (SEM) images illustrating the surface morphology of transparent semiconducting films according to two embodiments of the present invention.

A transparent semiconducting film was fabricated as the above described process and the constitution as shown in FIG. 1. The bottom film 2 and the top film 3 were made in a thickness of 350 nm and 1650 nm, respectively. The processing temperature of the top film 3 was at 25° C. Its optical, electrical and surface properties were characterized. An average total transmittance (TT), which measured from 400 nm to 1200 nm, was found to be 87.3%. A peak haze of 11.7% was found at 456 nm. A mean surface roughness (Ra) and a root mean square surface roughness (Rms) were found to be 25.4 nm and 31.7 nm, respectively. The sheet resistance was found to be 216 ohm/sq. An SEM image illustrating the surface morphology of the top film 3 is shown in FIG. 2 (left panel).

Example 1.2

A transparent semiconducting film was fabricated as the above described process and the constitution as shown in FIG. 1. The bottom film 2 and the top film 3 were made in a thickness of 350 nm and 1650 nm, respectively. The processing temperature of the top film 3 was at 200° C. Its optical, electrical and surface properties were characterized. An average total transmittance (TT), which measured from 400 nm to 1200 nm, was found to be 87.0%. A peak haze of 14.9% was found at 452 nm. A mean surface roughness (Ra) and a root mean square surface roughness (Rms) were found to be 27.3 nm and 33.9 nm, respectively. The sheet resistance was found to be 61.7 ohm/sq.

Example 1.3

A transparent semiconducting film was fabricated as the above described process and the constitution as shown in FIG. 1. The bottom film 2 and the top film 3 were made in a thickness of 350 nm and 1650 nm, respectively. The processing temperature of the top film 3 was at 250° C. Its optical, electrical and surface properties were characterized. An average total transmittance (TT), which measured from 400 nm to 1200 nm, was found to be 83.2%. A peak haze of 14.9% was found at 436 nm. A mean surface roughness (Ra) and a root mean square surface roughness (Rms) were found to be 25.5 nm and 32.0 nm, respectively. The sheet resistance was found to be 17.6 ohm/sq.

Example 1.4

A transparent semiconducting film was fabricated as the above described process and the constitution as shown in FIG. 1. The bottom film 2 and the top film 3 were made in a thickness of 350 nm and 1650 nm, respectively. The processing temperature of the top film 3 was at 300° C. Its optical, electrical and surface properties were characterized. An average total transmittance (TT), which measured from 400 nm to 1200 nm, was found to be 85.5%. A peak haze of 15.2% was found at 432 nm. A mean surface roughness (Ra) and a root mean square surface roughness (Rms) were found to be 25.3 nm and 31.8 nm, respectively. The sheet resistance was found to be 14.2 ohm/sq.

Example 1.5

A transparent semiconducting film was fabricated as the above described process and the constitution as shown in FIG. 1. The bottom film 2 and the top film 3 were made in a thickness of 350 nm and 1650 nm, respectively. The processing temperature of the top film 3 was at 350° C. Its optical, electrical and surface properties were characterized. An average total transmittance (TT), which measured from 400 nm to 1200 nm, was found to be 88.3%. A peak haze of 18.3% was found at 428 nm. A mean surface roughness (Ra) and a root mean square surface roughness (Rms) were found to be 25.4 nm and 31.8 nm, respectively. The sheet resistance was found to be 12.8 ohm/sq. An SEM image illustrating the surface morphology of the top film 3 is shown in FIG. 2 (right panel).

It can be seen from examples 1.1-1.5, which the film thicknesses are the same and the processing temperature is varied from 25° C. to 350° C., the peak haze is gradually increased from 11.7% to 18.3%. But there are no sharp changes in the average total transmittance (TT), which are just ~85%. In addition, there are also no enhancement on the surface roughness, which kept at the values of ~25 nm (Ra) and ~32 nm (Rms), even the processing temperature is elevated.

Figure 3:
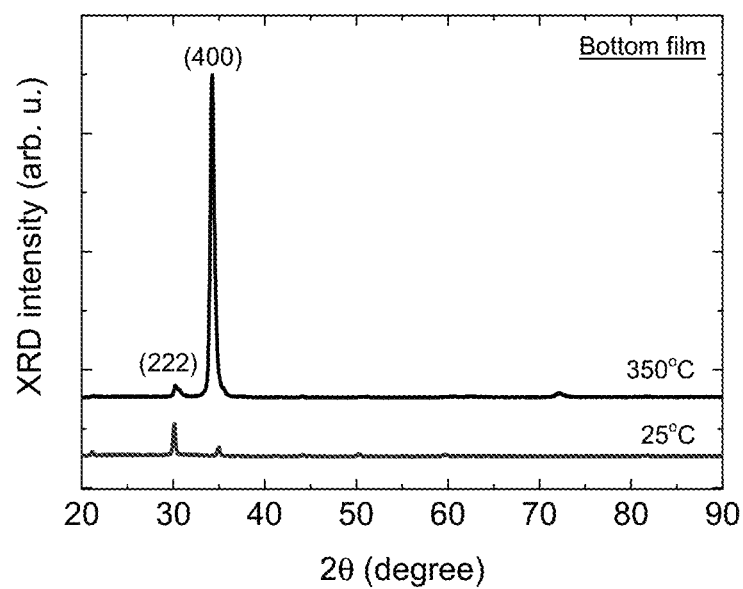
FIG. 3 is the X-Ray diffraction patterns of transparent semiconducting bottom film according to an embodiment of the present invention.
Figure 4:
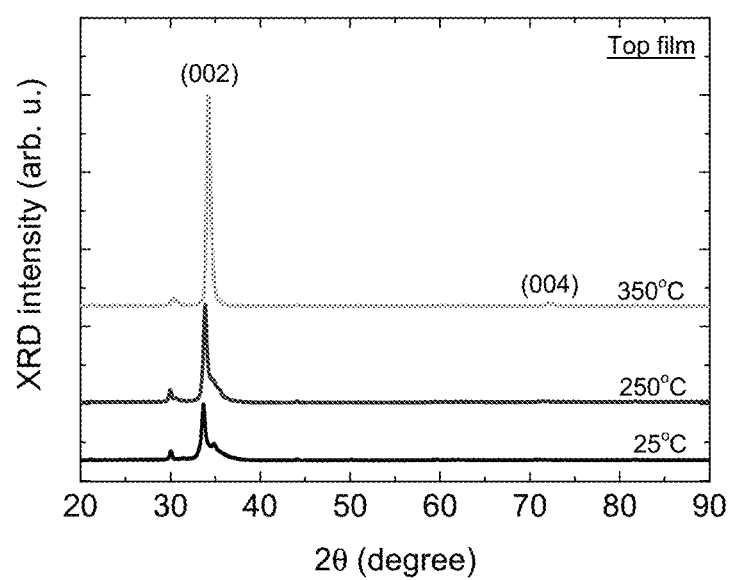
FIG. 4 is the X-Ray diffraction patterns of transparent semiconducting top film according to an embodiment of the present invention.

FIG. 2 depicts the SEM images of the film surface captured from example 1.1 and 1.5. A pronounced pyramid sharp can be observed on the film surface, particularly at 350° C. (example 1.5). It demonstrates that the elevation of the processing temperature just changes the surface morphology rather than the surface roughness, and thereby enhances the haze effect. Furthermore, it is found that the sheet resistance is lowered from 212 ohm/sq to 12.8 ohm/sq with the elevated temperature. FIG. 3 and FIG. 4 are, respectively the XRD patterns of the bottom film 2 and the top film 3. At a high processing temperature, for example 350° C., the films demonstrate strong (002) and (400) peaks. It can be the evident to explain the improvement of the electrical conductivity at high processing temperature due to the well-crystallized phase.

Example 2.1

A transparent semiconducting film was fabricated as the above described process and the constitution as shown in FIG. 1. The bottom film 2 and the top film 3 were made in a thickness of 150 nm and 1950 nm, respectively. The processing temperature of the top film 3 was at 350° C. Its optical, electrical and surface properties were characterized. An average total transmittance (TT), which measured from 400 nm to 1200 nm, was found to be 85.9%. A peak haze of 13.1% was found at 424 nm. A mean surface roughness (Ra) and a root mean square surface roughness (Rms) were found to be 16.8 nm and 21.3 nm, respectively. The sheet resistance was found to be 21.1 ohm/sq.

Example 2.2

A transparent semiconducting film was fabricated as the above described process and the constitution as shown in FIG. 1. The bottom film 2 and the top film 3 were made in a thickness of 250 nm and 1950 nm, respectively. The processing temperature of the top film 3 was at 350° C. Its optical, electrical and surface properties were characterized. An average total transmittance (TT), which measured from 400 nm to 1200 nm, was found to be 86.8%. A peak haze of 19.9% was found at 424 nm. A mean surface roughness (Ra) and a root mean square surface roughness (Rms) were found to be 23.0 nm and 28.9 nm, respectively. The sheet resistance was found to be 11.1 ohm/sq.

Example 2.3

A transparent semiconducting film was fabricated as the above described process and the constitution as shown in FIG. 1. The bottom film 2 and the top film 3 were made in a thickness of 400 nm and 1950 nm, respectively. The processing temperature of the top film 3 was at 350° C. Its optical, electrical and surface properties were characterized. An average total transmittance (TT), which measured from 400 nm to 1200 nm, was found to be 86.6%. A peak haze of 19.9% was found at 424 nm. A mean surface roughness (Ra) and a root mean square surface roughness (Rms) were found to be 23.6 nm and 29.9 nm, respectively. The sheet resistance was found to be 11.2 ohm/sq.

It can be seen from examples 2.1-2.3, which the thickness of the bottom film 2 is varied from 150 to 400 nm and the thickness of the top film 3 is made at 1950 nm processing at the temperature of 350° C., the peak haze is gradually increased from 13.1% to 19.9%. There are no sharp changes in the average total transmittance (TT), which are kept at ~86%. However, there is obviously enhancement on the surface roughness, which comes saturated for film 2 thickness over 250 nm. In addition, the sheet resistance is lowered from the 21.1 ohm/sq to 11.1 ohm/sq and saturated for film thickness over 250 nm. It can be known that the bottom film 2 also contributes to the electrical conductivity even a thick layer of film 3 is formed on top. In short, the thickness of the bottom film 2 is preferably at 250 nm to 400 nm.

Example 3.1

A transparent semiconducting film was fabricated as the above described process and the constitution as shown in FIG. 1. The bottom film 2 and the top film 3 were made in a thickness of 350 nm and 150 nm, respectively. The processing temperature of the top film 3 was at 350° C. Its optical, electrical and surface properties were characterized. An average total transmittance (TT), which measured from 400 nm to 1200 nm, was found to be 91.8%. No haze effect was found from the spectrum. A mean surface roughness (Ra) and a root mean square surface roughness (Rms) were found to be 3.8 nm and 4.8 nm, respectively. The sheet resistance was found to be 22.3 ohm/sq.

Example 3.2

A transparent semiconducting film was fabricated as the above described process and the constitution as shown in FIG. 1. The bottom film 2 and the top film 3 were made in a thickness of 350 nm and 1400 nm, respectively. The processing temperature of the top film 3 was at 350° C. Its optical, electrical and surface properties were characterized. An average total transmittance (TT), which measured from 400 nm to 1200 nm, was found to be 87.7%. A peak haze of 10.5% was found at 432 nm. A mean surface roughness (Ra) and a root mean square surface roughness (Rms) were found to be 18.9 nm and 23.7 nm, respectively. The sheet resistance was found to be 12.4 ohm/sq.

Example 3.3

A transparent semiconducting film was fabricated as the above described process and the constitution as shown in FIG. 1. The bottom film 2 and the top film 3 were made in a thickness of 350 nm and 1650 nm, respectively. The processing temperature of the top film 3 was at 350° C. Its optical, electrical and surface properties were characterized. An average total transmittance (TT), which measured from 400 nm to 1200 nm, was found to be 88.3%. A peak haze of 18.3% was found at 428 nm. A mean surface roughness (Ra) and a root mean square surface roughness (Rms) were found to be 25.4 nm and 31.8 nm, respectively. The sheet resistance was found to be 12.8 ohm/sq.

Example 3.4

A transparent semiconducting film was fabricated as the above described process and the constitution as shown in FIG. 1. The bottom film 2 and the top film 3 were made in a thickness of 350 nm and 1950 nm, respectively. The processing temperature of the top film 3 was at 350° C. Its optical, electrical and surface properties were characterized. An average total transmittance (TT), which measured from 400 nm to 1200 nm, was found to be 86.6%. A peak haze of 20.0% was found at 428 nm. A mean surface roughness (Ra) and a root mean square surface roughness (Rms) were found to be 24.8 nm and 31.2 nm, respectively. The sheet resistance was found to be 11.2 ohm/sq.

Example 3.5

A transparent semiconducting film was fabricated as the above described process and the constitution as shown in FIG. 1. The bottom film 2 and the top film 3 were made in a thickness of 350 nm and 2300 nm, respectively. The processing temperature of the top film 3 was at 350° C. Its optical, electrical and surface properties were characterized. An average total transmittance (TT), which measured from 400 nm to 1200 nm, was found to be 83.5%. A peak haze of 27.8% was found at 436 nm. A mean surface roughness (Ra) and a root mean square surface roughness (Rms) were found to be 27.7 nm and 34.4 nm, respectively. The sheet resistance was found to be 8.7 ohm/sq.

As shown in example 3.1-3.5, when the thickness of film 3 was varied from 150 nm to 2300 nm and the thickness of film 2 was kept at 350 nm, the peak haze was sharply increased from nothing to 27.8%. However, the average total transmittance (TT) was gradually decreased from 91.8% to 83.5%. In addition, the surface roughness was also significantly improved, for example, Ra was increased from 3.8 nm to 27.7 nm. It can be clearly seen that the thickness of film 3 can govern the surface roughness and optical transmittance. A relatively thicker film can introduce a rougher film surface and thereby improves the haze effect, but reduces the average total transmittance (TT). Thus, there is a trade-off between the optical transmittance and haze effect. For retaining a good transmittance (i.e. >85%) and a good haze effect (i.e. >15%), the thickness of top film 3 is preferable from 1500 nm to 2000 nm.

Comparative Example 1.1

A transparent semiconducting film was fabricated according to the process as described herein and the constitution as shown in FIG. 1. The bottom film 2 and the top film 3 were made in a thickness of 350 nm and 0 nm, respectively. The processing temperature of the bottom film 2 was at 350° C. Its optical, electrical and surface properties were characterized. An average total transmittance (TT), which measured from 400 nm to 1200 nm, was found to be 91.1%. No haze effect was found from the spectrum. A mean surface roughness (Ra) and a root mean square surface roughness (Rms) were found to be 1.8 nm and 2.5 nm, respectively. The sheet resistance was found to be 33.6 ohm/sq.

Comparative Example 1.2

A transparent semiconducting film was fabricated as the above described process and the constitution as shown in FIG. 1. The bottom film 2 and the top film 3 were made in a thickness of 0 nm and 1650 nm, respectively. The processing temperature of the top film 3 was at 350° C. Its optical, electrical and surface properties were characterized. An average total transmittance (TT), which measured from 400 nm to 1200 nm, was found to be 91.7%. A peak haze of 10.9% was found at 424 nm. A mean surface roughness (Ra) and a root mean square surface roughness (Rms) were found to be 15.3 nm and 20.0 nm, respectively. The sheet resistance was found to be 74.6 ohm/sq.

Comparative example 1.1 is a single film 2 only. It is seen that the bottom film 2 is a flat layer. There is no haze effect that can be observed. The Ra and Rms are just 1.8 nm and 2.5 nm, respectively, which are ten times less than the surface roughness of example 1.5. Thus, the ups and downs surface feature of film 3 is not contributed by the surface topography of film 2.

On the other hand, a sole film 3 is made in comparative example 1.2. Without the bottom film 2, the film 3 can exhibit a peak haze of 10.9% and a surface roughness Ra of 15.3 nm. However, it is still ~2 times less than the dual film 23 shown in example 1.5. It demonstrates that a high texture surface cannot be formed on a sole film. In short, the bottom film 2 cannot offer a ups and downs surface texture but can assist the growth of the top film 3 in forming a high degree of roughness on the film surface.

TABLE 1

| | Films formation conditions | | | Optical characteristics | | Surface roughness | | Electrical property |
|---|---|---|---|---|---|---|---|---|
| | Film 2 thickness (nm) | Film 3 thickness (nm) | Process. temp. (° C.) | TT (%) | Peak haze (%) | Ra (nm) | Rms (nm) | Sheet resistance (ohm/sq) |
| Ex. 1.1 | 350 | 1650 | 25 | 87.3 | 11.7 | 25.4 | 31.7 | 216 |
| Ex. 1.2 | 350 | 1650 | 200 | 87.0 | 14.9 | 27.3 | 33.9 | 61.7 |
| Ex. 1.3 | 350 | 1650 | 250 | 83.2 | 14.9 | 25.5 | 32.0 | 17.6 |
| Ex. 1.4 | 350 | 1650 | 300 | 85.5 | 15.2 | 25.3 | 31.8 | 14.2 |
| Ex. 1.5 | 350 | 1650 | 350 | 88.3 | 18.3 | 25.4 | 31.8 | 12.8 |
| Ex. 2.1 | 150 | 1950 | 350 | 85.9 | 13.1 | 16.8 | 21.3 | 21.1 |
| Ex. 2.2 | 250 | 1950 | 350 | 86.8 | 19.9 | 23.0 | 28.9 | 11.1 |
| Ex. 2.3 | 400 | 1950 | 350 | 86.6 | 19.9 | 23.6 | 29.9 | 11.2 |
| Ex. 3.1 | 350 | 150 | 350 | 91.8 | — | 3.8 | 4.8 | 22.3 |
| Ex. 3.2 | 350 | 1400 | 350 | 87.7 | 10.5 | 18.9 | 23.7 | 12.4 |
| Ex. 3.3 | 350 | 1650 | 350 | 88.3 | 18.3 | 25.4 | 31.8 | 12.8 |
| Ex. 3.4 | 350 | 1950 | 350 | 86.6 | 20.0 | 24.8 | 31.2 | 11.2 |
| Ex. 3.5 | 350 | 2300 | 350 | 83.5 | 27.8 | 27.7 | 34.4 | 8.7 |
| Comp. Ex. 1.1 | 350 | 0 | 350 | 91.1 | — | 1.8 | 2.5 | 33.6 |
| Comp. Ex. 1.2 | 0 | 1650 | 350 | 91.7 | 10.9 | 15.3 | 20.0 | 74.6 |

First Implementation Embodiment—Application in Light-Emitting Device

This embodiment is to use the transparent semiconducting texturing films as the front/back electrode in forming a light-emitting device, preferably in a nitride-based light-emitting device, for improving the light extraction.

Figure 5:
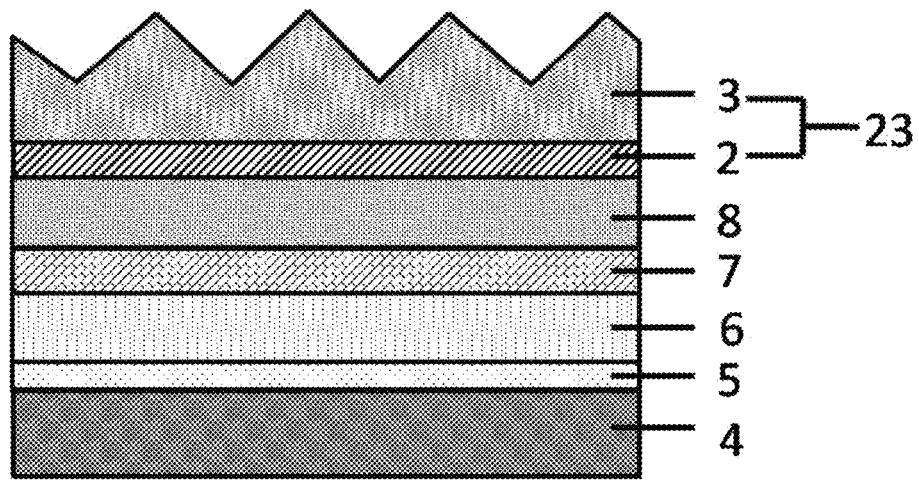
FIG. 5 is the cross-sectional view showing a manufacturing method for a nitride-based light-emitting device according to the first implementation embodiment of the present invention.

As shown in FIG. 5, it is the cross-sectional view showing a manufacturing method for a nitride-based light-emitting device, according to the embodiment of the present invention. The nitride-based light-emitting device consisting of a buffer layer 5, n-doped nitride based semiconducting layer 6, a nitride based quantum-well layer 7, a p-doped nitride based semiconducting layer 8, and a transparent conducting electrode 23, are sequentially formed on a base substrate 4. The transparent conducting electrode 23 is made of stacked indium oxide ($In_2O_3$) based semiconducting layer and zinc oxide (ZnO) based semiconducting layer according to the first embodiment as shown in FIG. 1.

The film 2 may preferably consist of cerium oxide ($CeO_2$). The indium oxide doped with cerium oxide, namely ICO, has a high refractive index of 2.1. It may suppress the refractive index mismatch with the nitride based semiconducting layer 8, which has refractive index of 2.5, for improving the light extraction. The texturing film 3 may further relax the light trapped in the device due to the total internal reflection.

In short, this embodiment uses the features of the transparent semiconducting texturing films, like the high refractive index and texturing surface, for reducing the light trapping and enhancing the light extraction capability in the nitride-based light-emitting device.

Second Implementation Embodiment—Application in Multi-Junction Solar Cell

This embodiment is to use the transparent semiconducting texturing films as the front/intermediate/back electrode in forming a multi-junction solar cell for improving the light trapping effect.

Figure 6:
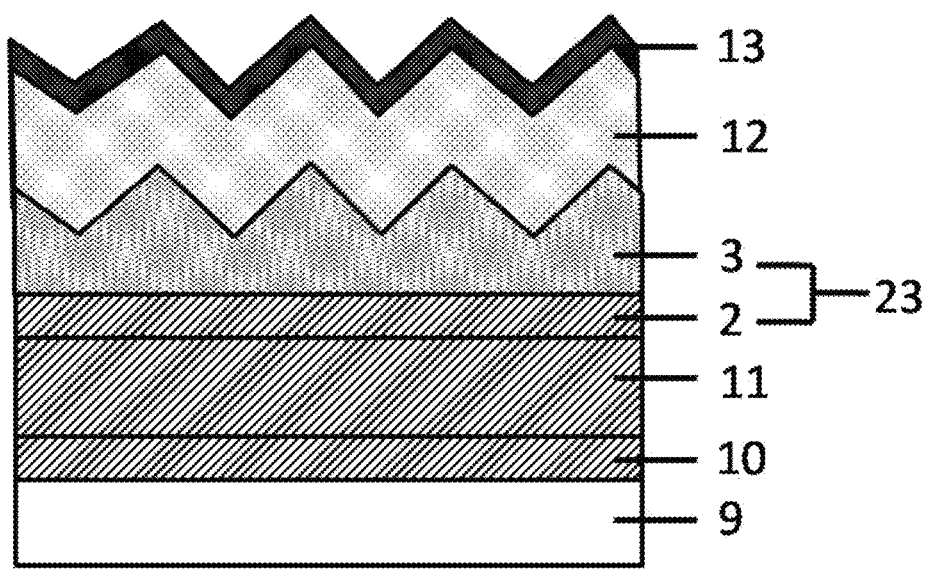
FIG. 6 is the cross-sectional view showing a manufacturing method for a multi-junction solar cell according to the second implementation embodiment of the present invention.

As shown in FIG. 6, it is the cross-sectional view showing a manufacturing method for a multi-junction solar cell, according to the embodiment of the present invention. The multi-junction solar cell consisting of a surface electrode 10, stacks of a photovoltaic semiconducting layer 11 and 12, an intermediate layer 23, and a backside electrode 13, are sequentially formed on a base substrate 9. The intermediate layer 23 is made of stacked indium oxide ($In_2O_3$) based semiconducting layer and zinc oxide (ZnO) based semiconducting layer according to the first embodiment as shown in FIG. 1.

The film 2 may preferably consist of titanium oxide ($TiO_2$) or tungsten oxide ($WO_3$). The indium oxide doped with titanium oxide ($TiO_2$), namely ITiO, or doped with tungsten oxide ($WO_3$), namely IWO, either has strong light transmittance at NIR range. It may improve the light transmission to stacks of the photovoltaic semiconducting layer 11 which has low energy absorption. The texturing film 3 may further enhance the light trapped in layers 11 and 12 due to the total internal reflection, which the optical path is now rearranged by the texturing surface at the interface of layer 3 and layer 12.

In short, this embodiment uses the features of the transparent semiconducting texturing films, like the high NIR transmittance and texturing surface, for enhancing the light trapping and improving the light absorption capability in the multi-junction solar cell.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

INDUSTRIAL APPLICABILITY

The present invention is useful in photovoltaic, display and solid-state lighting industries which require a semiconducting material with good electrical conductivity, optical transparency and good interfacial adhesion. The simple two-step sputtering process of the present invention is also easy to practice and be optimized in order to form surface-textured TCO with high haze, e.g., over 50%, by varying the thickness of the layer(s) and/or corresponding processing conditions during sputtering.

What is claimed is:

1. A transparent semiconductor comprising:
at least a bottom layer and at least a top layer sequentially deposited on a base substrate, wherein said bottom layer and top layer are made of at least two different metal oxides having two different crystalline temperatures,
wherein said top layer is direct textured to form a plurality of pyramid-like structures on the surface thereof having only an orientation peak at 34±0.4 degrees two theta in a XRD pattern thereof.

2. The transparent semiconductor according to claim 1, wherein one of the at least two metal oxides is selected from indium oxide ($In_2O_3$), $SnO_2$, ZnO, CdO, $InO_{1.5}$, $GaO_{1.5}$, NiO, or $CuMO_2$, where M is Al, Ga, In, Sc, Cr, Y, or B; and the other of the at least two metal oxides is zinc oxide (ZnO) or tin oxide ($SnO_2$) sequentially deposited on said base substrate.

3. The transparent semiconductor according to claim 2, wherein said indium oxide based bottom layer is doped with a metal oxide selected from the group consisting of titanium oxide ($TiO_2$), cerium oxide ($CeO_2$), tungsten oxide ($WO_3$) and tin oxide ($SnO_2$).

4. The transparent semiconductor according to claim 2, wherein the zinc oxide based top layer is doped with a metal oxide selected from the group consisting of gallium oxide ($Ga_2O_3$), aluminum oxide ($Al_2O_3$) and boron oxide ($B_2O_3$).

5. The transparent semiconductor according to claim 2, wherein the tin oxide based top layer is doped with a metal oxide selected from the group consisting of gallium oxide ($Ga_2O_3$), aluminum oxide ($Al_2O_3$) and antimony oxide ($Sb_2O_3$).

6. The transparent semiconductor according to claim 3, wherein the titanium oxide has a weight ratio from 1% to 5% with respect to the total weight of said indium oxide based bottom layer doped with said titanium oxide (ITiO).

7. The transparent semiconductor according to claim 3, wherein the cerium oxide has a weight ratio of 10% with respect to the total weight of said indium oxide based bottom layer doped with said cerium oxide (ICO).

8. The transparent semiconductor according to claim 3, wherein the tungsten oxide has a weight ratio of 1% with respect to the total weight of said indium oxide based bottom layer doped with said tungsten oxide (IWO).

9. The transparent semiconductor according to claim 3, wherein the film thickness of said bottom layer is 150 nm to 600 nm.

10. The transparent semiconductor according to claim 4, wherein the film thickness of said top layer is 150 nm to 2,200 nm.

11. A method for fabricating a transparent semiconductor on a base substrate comprising:

sequentially depositing a first metal oxide and a second metal oxide having two different crystalline temperatures forming at least two semiconducting layers on said base substrate by at least two rounds of sputtering under a first processing temperature and a second processing temperature, respectively; and controlling thickness for each of said layers during said sequential depositing, wherein a top layer of said at least two semiconducting layers is direct textured by said sputtering to form a plurality of pyramid-like structures on the surface thereof.

12. The method according to claim 11, wherein said first metal oxide is selected from indium oxide ($In_2O_3$), $SnO_2$, ZnO, CdO, $InO_{1.5}$, $GaO_{1.5}$, NiO, or $CuMO_2$, where M is Al, Ga, In, Sc, Cr, Y, or B; and said second metal oxide is zinc oxide (ZnO) or tin oxide ($SnO_2$).

13. The method according to claim 11, wherein the first processing temperature for depositing the first metal oxide based semiconducting layer is at about 25° C., room temperature, or a temperature below the crystalline temperature of any of said metal oxides.

14. The method according to claim 11, wherein the second processing temperature for depositing the second metal oxide based semiconducting layer is from 25° C., room temperature, or a temperature below the crystalline temperature of any of said metal oxides to 350° C.

15. The method according to claim 11, wherein the thickness of the first metal oxide based semiconducting layer is from 150 nm to 600 nm.

16. The method according to claim 11, wherein the thickness of the second metal oxide based semiconducting layer is from 150 nm to 2,200 nm.

17. The method according to claim 12, wherein said indium oxide ($In_2O_3$) is doped with a metal oxide selected from the group consisting of titanium oxide ($TiO_2$), cerium oxide ($CeO_2$), tungsten oxide ($WO_3$) and tin oxide ($SnO_2$).

18. The method according to claim 12, wherein said zinc oxide (ZnO) is doped with a metal oxide selected from the group consisting of gallium oxide ($Ga_2O_3$), aluminum oxide ($Al_2O_3$) and boron oxide ($B_2O_3$).

19. A multi-junction solar comprising a surface electrode, stacks of a photovoltaic semiconducting layer, an intermediate layer, and a backside electrode, being sequentially formed on a base substrate, wherein said intermediate layer is the transparent semiconductor according to claim 1.

20. A nitride-based light-emitting device comprising a buffer layer, n-doped nitride based semiconducting layer, a nitride based quantum-well layer, a p-doped nitride based semiconducting layer, a transparent conducting electrode, being sequentially formed on a base substrate, wherein said transparent conducting electrode is the transparent semiconductor according to claim 1.

* * * * *